United States Patent

Wicker et al.

[11] Patent Number: 5,862,031
[45] Date of Patent: Jan. 19, 1999

[54] ESD PROTECTION CIRCUIT FOR INTEGRATED CIRCUITS HAVING A BIPOLAR DIFFERENTIAL INPUT

[75] Inventors: Charles R. Wicker, Hayward; Stephen D. Parks, Pleasanton; Derek F. Bowers, Sunnyvale, all of Calif.

[73] Assignee: Analog Devices, Inc., Norwood, Mass.

[21] Appl. No.: 979,066

[22] Filed: Nov. 26, 1997

[51] Int. Cl.$^6$ .................................................... H02H 3/22
[52] U.S. Cl. .......................................... 361/111; 361/56
[58] Field of Search ............................... 361/56, 111, 91; 327/52, 65, 81, 310, 313–314; 330/207 P, 298, 258, 261; 257/355–357, 360

[56] References Cited

U.S. PATENT DOCUMENTS

| | | | |
|---|---|---|---|
| 4,044,313 | 8/1977 | Wittlinger et al. | 330/207 P |
| 4,158,863 | 6/1979 | Naylor | 361/56 |
| 4,440,980 | 4/1984 | Bakker | 379/395 |
| 4,940,907 | 7/1990 | Laude | 327/73 |
| 5,043,675 | 8/1991 | Gilbert | 330/258 |
| 5,528,188 | 6/1996 | Au et al. | 327/310 |
| 5,563,757 | 10/1996 | Corsi | 361/56 |
| 5,625,280 | 4/1997 | Voldman | 323/284 |
| 5,637,901 | 6/1997 | Beigel et al. | 257/355 |
| 5,670,799 | 9/1997 | Croft | 257/173 |

OTHER PUBLICATIONS

Maxim 1992 New Releases Data Book, MAX900/901/902/903, pp. 8–51–8–62.

Derived Schematic Diagram for Maxim 90X Voltage Comparators. (No Date).

Linear Technology Corp. Data Book, LT1016, pp. 6–25–6–40. (No Date).

Precision Monolithics, Inc. 1989 Data Book, Rev. B1, Voltage Comparators, PM–111/PM–211, pp. 8–51.

Wunsch et al., Determination of Threshold Failure Levels of Semiconductor Diodes and Transistors Due to Pulse Voltages, Braddock, Dunn and McDonald, Inc., El Paso, Texas, pp. 244–259. (No Date).

*Primary Examiner*—Jeffrey Gaffin
*Assistant Examiner*—Michael J. Sherry
*Attorney, Agent, or Firm*—Koppel & Jacobs

[57] ABSTRACT

An ESD protection circuit allows a certain level of ESD current to flow through a protected circuit, and actuates a bypass path for greater ESD current levels when the sensed current reaches a threshold level. For a protected circuit having a pair of differential input terminals and a reference voltage terminal, the bypass path is provided between an input terminal which receives an ESD and the reference voltage terminal when the reference voltage is fixed, and between the two input terminals when the reference voltage is floating. The bypass circuit is preferably implemented with a pair of bipolar transistors of a first conductivity that are actuated by an ESD current flow through the protected circuit, and a pair of bipolar transistors of opposite conductivity that are actuated by current flows through the first conductivity transistors.

17 Claims, 6 Drawing Sheets

ESD PROTECTION CIRCUIT FOR INTEGRATED CIRCUITS HAVING A BIPOLAR DIFFERENTIAL INPUT

BACKGROUND OF THE INVENTION

1. Field of the Invention

This invention relates to electrostatic discharge (ESD) protection for circuits which employ bipolar transistors, and more particularly for circuits having a bipolar differential input.

2. Description of the Related Art

ESD events that occur differentially across the inputs of an unprotected bipolar differential input stage can produce currents that may permanently damage reverse biased base-emitter transistor junctions in the circuit. A common way to protect circuits such as comparators and operational amplifiers from ESD employs one or more diode-connected bipolar transistors at the node(s) to be protected. When an ESD event occurs at the protected node the breakdown voltage of the diode-connected transistor is exceeded, causing the transistor to conduct and draw the ESD current away from the protected circuit. One such protection scheme, disclosed in U.S. Pat. No. 5,637,901, protects an ingrated circuit (IC) from ESD spikes introduced at external terminal points. Since the diode-connected transistor breakdown voltage is almost always larger then the input differential breakdown voltage of an IC which includes a differential input stage, large resistors are connected in series with the inputs to limit the ESD currents flowing in the protected circuit. However, large resistors of this type degrade the performance of high speed ICs, which are intended to have propagation delays of less than 50 nanoseconds (nS).

The LT1016 comparator by Linear Technology Corporation has its differential input pins protected by connecting back-to-back diode-connected transistors in series across the circuit inputs. To be effective, the reverse bias emitter-base breakdown voltage of each diode-connected protection transistor must be lower than the reverse bias emitter-base breakdown voltages of the protected IC input stage, which may lead to a requirement for special fabrication processing. In addition, the diode-connected transistors are susceptible to the same degradation as that from which the input stage is being protected.

The Maxim Corporation MAX900/901 Voltage comparator employs diode-connected transistors in series with each differential input so that the protected input differential breakdown voltage includes the emitter-collector breakdown voltage of one diode-connected transistor and the base-collector voltage of the other. To work properly, additional diode-connected transistors are needed between each protected input and the positive and negative voltage supply lines to prevent differential ESD voltages from reaching the protected differential breakdown voltage. These additional diode-connected transistors limit the functional input voltage range of the protected device.

SUMMARY OF THE INVENTION

This invention seeks to provide ESD protection for differential circuits which employ bipolar transistors, such as the differential input stages of bipolar IC comparator and operational amplifier circuits, while allowing the protected circuit to operate with large differential-mode and common-mode voltages. The invention also seeks to minimize any reduction in circuit speeds related to the ESD protection.

These goals are achieved with an ESD bypass circuit that responds to an actuation signal by providing an ESD bypass path to prevent the ESD from damaging a protected circuit. The actuation signal is provided by the protected circuit itself, preferably in the form of a progressively increasing current when an ESD is applied. Before the current reaches a damage threshold level it triggers the bypass path into conduction to shunt higher ESD currents away from the protected circuit.

In a preferred embodiment the bypass circuit consists of a pair of bipolar transistors of one conductivity that are connected to be actuated by a current flow through the protected circuit, and a second pair of bipolar transistors of opposite conductivity to the first pair that are actuated by current flows through the first pair. The ESD bypass path varies, depending upon the location of the ESD event and the voltage at the protected circuit's reference voltage terminal. With an ESD at one input terminal and a fixed reference voltage, the bypass path runs between the reference voltage terminal and the input terminal at which the ESD is applied. The bypass path includes one of the second conductivity transistors for a positive ESD and, for a negative ESD, also one of the first conductivity transistors. The transistors are actuated by low level ESD-induced currents through the protected current.

When the voltage at the reference voltage terminal is floating, on the other hand, the bypass path is established between the two input terminals through the two second conductivity transistors, which in turn are actuated by an ESD-induced current flow through one of the first conductivity transistors. This current flow is preferably sensed by means of resistors, in the ESD current flow path, which develop voltages to actuate the appropriate transistors in the bypass circuit.

The invention thus make use of a small, non-damaging current flow through the protected circuit itself to trigger the protection circuitry, which otherwise is inactive.

These and further features and advantages of the invention will be apparent to those skilled in the art by the following detailed description, together with the accompanying drawings.

DETAILED DESCRIPTION OF THE INVENTION

Figure 1:
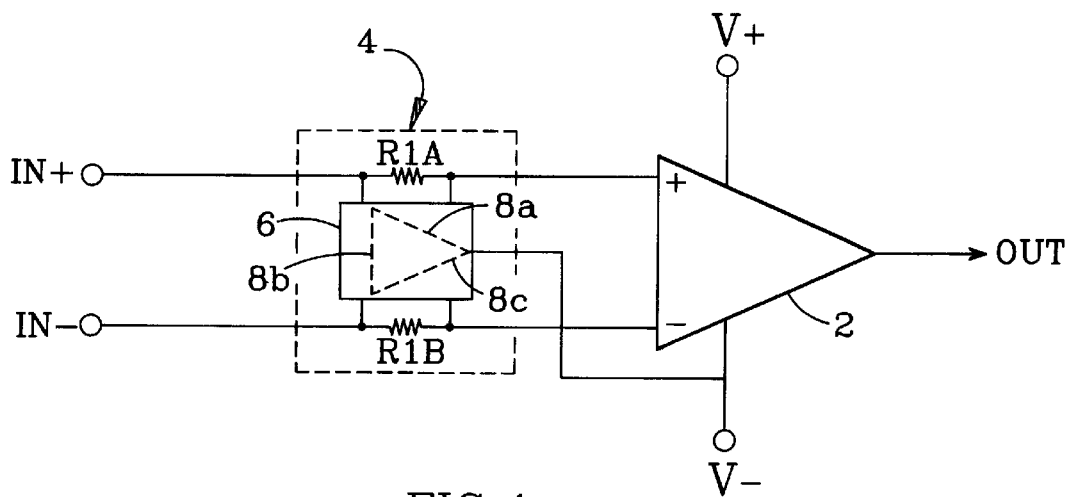
FIG. 1 is a block diagram illustrating the principals of the invention.

FIG. 1 illustrates the concept of the invention in block diagram form. Rather than trying to prevent any ESD at all from reaching a protected circuit 2 such as a comparator or operational amplifier, the invention intentionally allows some ESD current to flow through the protected circuit but triggers the protection mechanism before the current becomes excessive. The invention provides a greater enhancement for comparators, which operate with greater differential voltage savings than do op amps.

The protection circuit 4 includes an ESD sensing mechanism, preferably in the form of a pair of sense resistors R1A and R1B connected between the protected circuit and its non-inverting and inverting input terminals IN+ and IN−, respectively. When the flow of current to or from either IN+ or IN− reaches a level that indicates an ESD event, the current to the protected circuit 2 actuates a bypass circuit 6 within the protection circuitry. This circuit provides a bypass path that avoids the protected circuit for further current increments. Depending upon which of the two input terminals receives the ESD, upon whether the voltages at the other input terminal and at the protected circuit's voltage reference terminal (negative voltage supply V−) are fixed or floating, and also upon whether the ESD is positive or negative, the bypass path for an ESD event on the IN+ terminal can either be to V− through path 8a or to IN− through path 8b, while the bypass path for an ESD at IN− can either be to V− through bypass path 8c or to IN+ along path 8b. The protected circuit currents that flow through resistors R1A and R1B produce voltages across these resistors that trigger the protection circuitry into operation. This reduces any loss of circuit speed that might otherwise result, and allows the protected circuit to operate with large differential-mode and common-mode voltages.

Figure 2A:
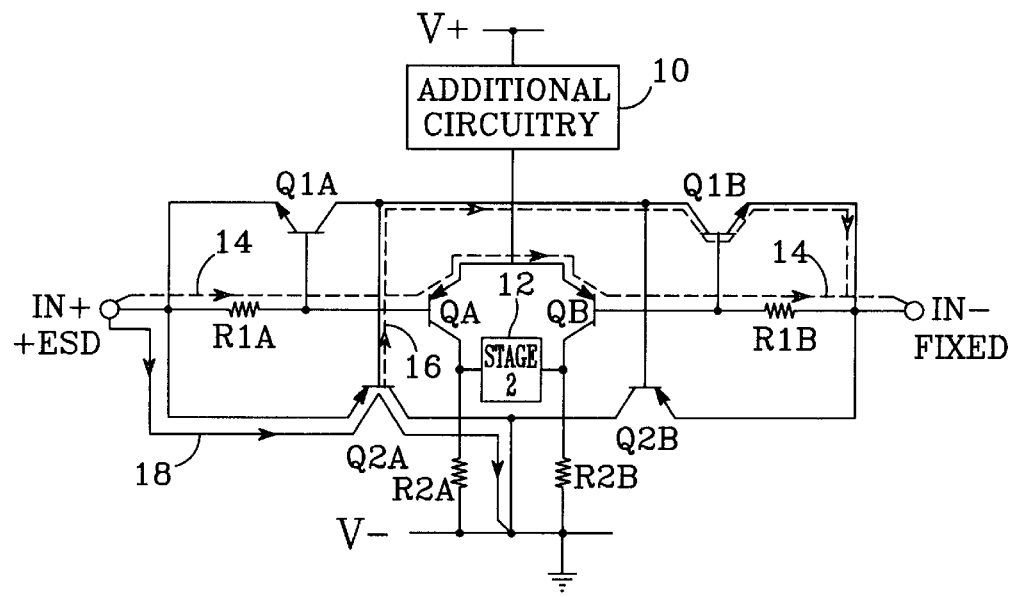
FIGS. 2a and 2b are schematic diagrams of the invention with a fixed inverting input voltage, a grounded negative supply voltage, and respective positive and negative ESD events at the non-inverting input.

FIGS. 2a, 2b, 3a, 3b, 4a and 4b show a preferred implementation of the ESD protection circuit in connection with the input stage of a comparator, and illustrate the protection circuit's response to various ESD situations. Referring first to FIG. 2a, the first comparator stage is shown consisting of differentially connected pnp transistors QA and QB, with the transistor collectors connected through respective resistors R2A and R2B to V−, and their emitters connected together through whatever additional circuitry 10 may be desired to a positive voltage supply V+. A connection to the second stage 12 is taken from the collectors of QA and QB. The protection circuit to be described can also be used to protect circuits with npn transistors.

The current sensing resistors R1A and R1B are connected respectively between IN+ and the base of QA, and between IN− and the base of QB. The protection circuit also includes a pair of npn transistors Q1A and Q1B that have their bases connected respectively to the bases of QA and QB, their emitters connected respectively to IN+ and IN−, and their collectors connected together. A pair of pnp transistors Q2A and Q2B have their bases connected together to the collectors of Q1A and Q1B, their emitters connected respectively to IN+ and IN−, and their collectors connected together to V−. Preferably, Q1A and Q1B are identical vertical devices, Q2A and Q2B are also identical vertical devices, and R1A, R1B are identical diffused resistors. The ESD protection circuit must shunt ESD current away from the protected stage, and in addition must be able to withstand the high power dissipation during a typical ESD burst of several hundred nanoseconds. Its effect on the protected circuit's functional parameters should also be minimal.

Assume first that an ESD event occurs differentially across the differential inputs, with a positive ESD voltage at IN+, the voltage at IN− fixed, and V− grounded. As the ESD proceeds, the differential voltage quickly builds up to a value equal to the sum of the base-emitter voltage of QB and the reverse base-emitter breakdown voltage of QA, at which time current begins to flow between IN+ and IN−. This current flows through R1A, the reverse biased base-emitter junction of QA, the forward biased base-emitter junction of QB, and R1B. The current flow, indicated by dashed line 14, continues to build up until the voltage across R1B turns Q1B ON (at about 0.6 volts). As Q1B conducts its collector current passes through the forward biased base-collector junction of Q1A and also through the forward biased base-emitter junction of Q2A (dashed current line 16), turning Q2A ON. Thus, any additional current from the ESD source passes from IN+ through the emitter-collector circuit of conductive transistor Q2A to the grounded at V−. The predominant path for the ESD current spike in excess of the current necessary to turn Q1B ON bypasses the comparator input circuitry. The current level at which the protection circuit is actuated is set by the resistance values of R1A and R1B, which are selected to prevent damage to the input stage while allowing for a full range of normal input voltages. The primary ESD current flow through Q2A is indicated by solid line 18.

Figure 2B:
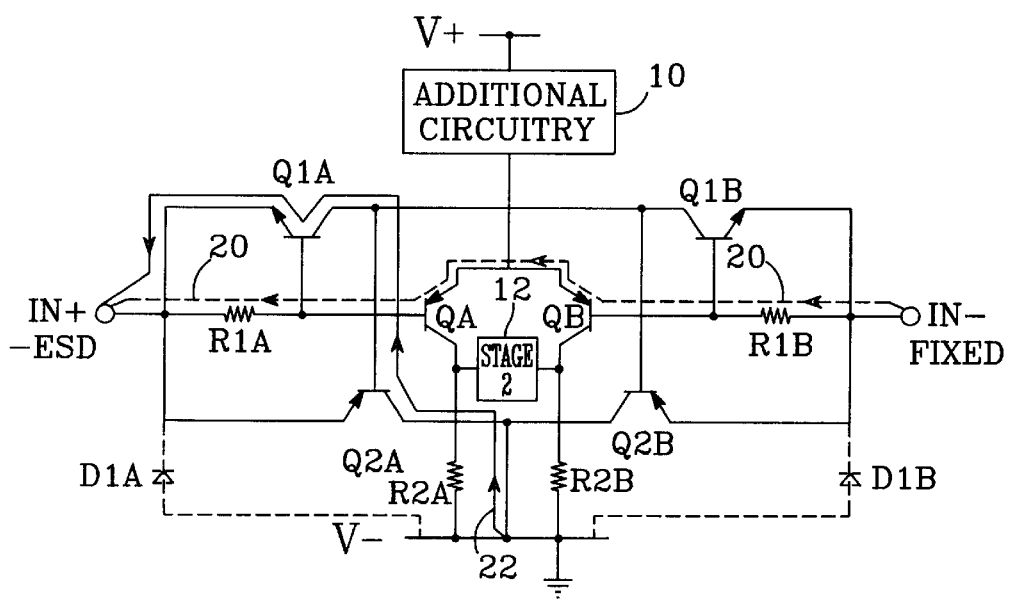

FIG. 2b illustrates the reaction of the same circuit to a negative ESD event at IN+, again with IN− fixed and V− at ground. Once the differential ESD voltage exceeds the base-emitter voltage of QA and the reverse biased base-emitter breakdown voltage of QB, a current (dashed line 20) begins to flow from IN− to IN+. This current builds until the voltage drop across R1A turns Q1A ON (typically about 0.6 volts). This forward biases the collector-base junction of Q2A, allowing the primary ESD current to be drawn from V− through the collector-base junction of Q2A and the collector-emitter circuit of Q1A to IN+, as indicated by solid line 22.

Optional diodes D1A and D1B may be added between IN+ and IN−, respectively, and V− for improved protection against negative ESD events occurring at either input terminal with respect to the V− terminal. These diodes are shown in dashed lines. They provide a robust shunt current path while avoiding any reduction in the functionality of either the protected circuit or the ESD protection scheme.

Figure 3A:
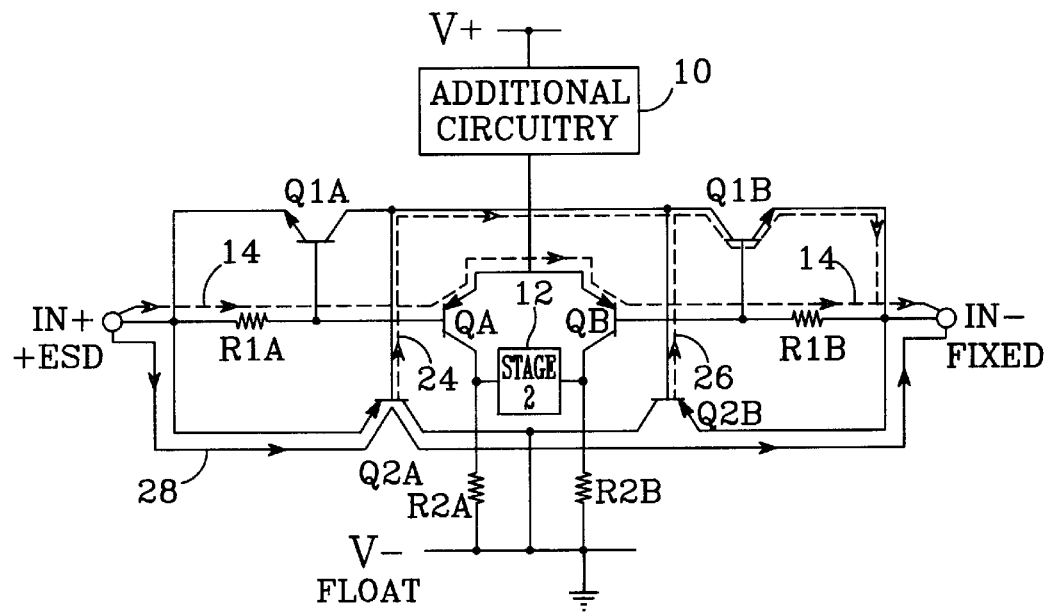
FIGS. 3a and 3b are schematic diagrams of the invention with a fixed inverted input voltage, a floating negative supply voltage, and respective positive and negative ESD events at the non-inverting input terminal.

FIG. 3a illustrates the situation with a positive ESD event at IN+, the voltage at IN− fixed and V− floating. The differential ESD voltage causes a current to flow between IN+ and IN− through the base-emitter circuits of QA and QB, the same as for FIG. 2a. This current is designated by reference number 14 as in FIG. 2a. It again establishes a voltage drop across R1B that triggers Q1B into conduction. The collector-emitter current of Q1B is drawn from the bases of Q2A and Q2B (dashed lines 24 and 26), turning these transistors ON. The predominant ESD current then flows from IN+ through the collector-emitter circuits of Q2A and Q2B (in the reverse breakdown direction for Q2B) to IN−, as indicated by solid line 28. For this purpose, Q2A and Q2B should have good high current gains.

Figure 3B:
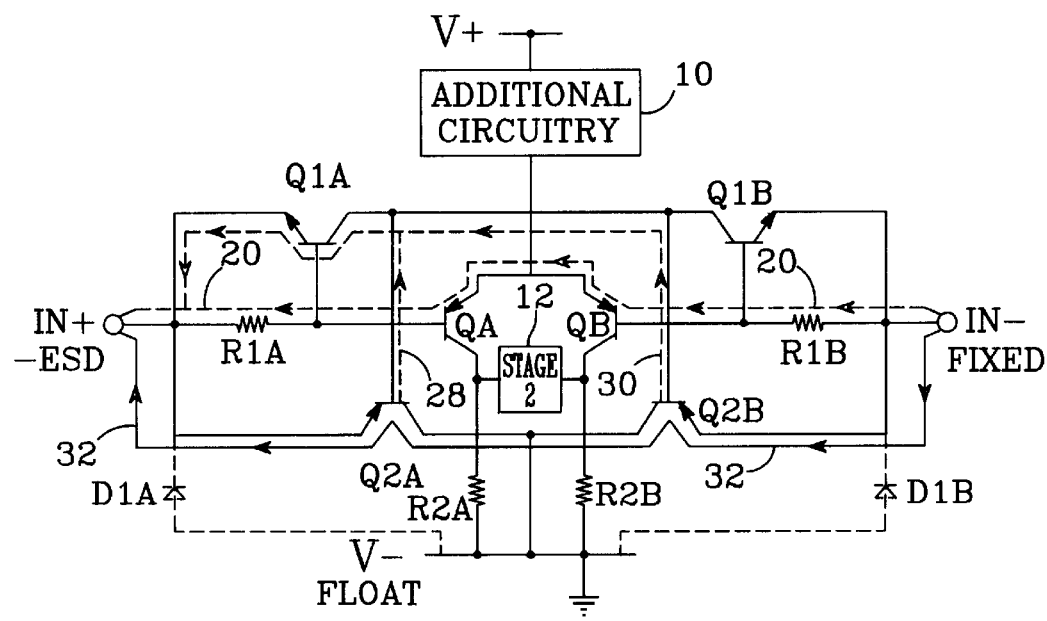

FIG. 3b illustrates a situation similar to FIG. 3a, but with a negative ESD at IN+. As with FIG. 2b, this causes a current (dashed line 20) to flow from IN− to IN+ through the base-emitter circuits of QB and QA. The voltage across R1A turns on Q1A, which draws current from the bases of Q2A and Q2B (dashed lines 28 and 30) to turn these devices ON. The predominant ESD current flow (solid line 32) is then from IN− to IN+ through the emitter-collector circuits of Q2B and Q2A, in the reverse direction from the current flow in FIG. 3a.

Figure 4A:
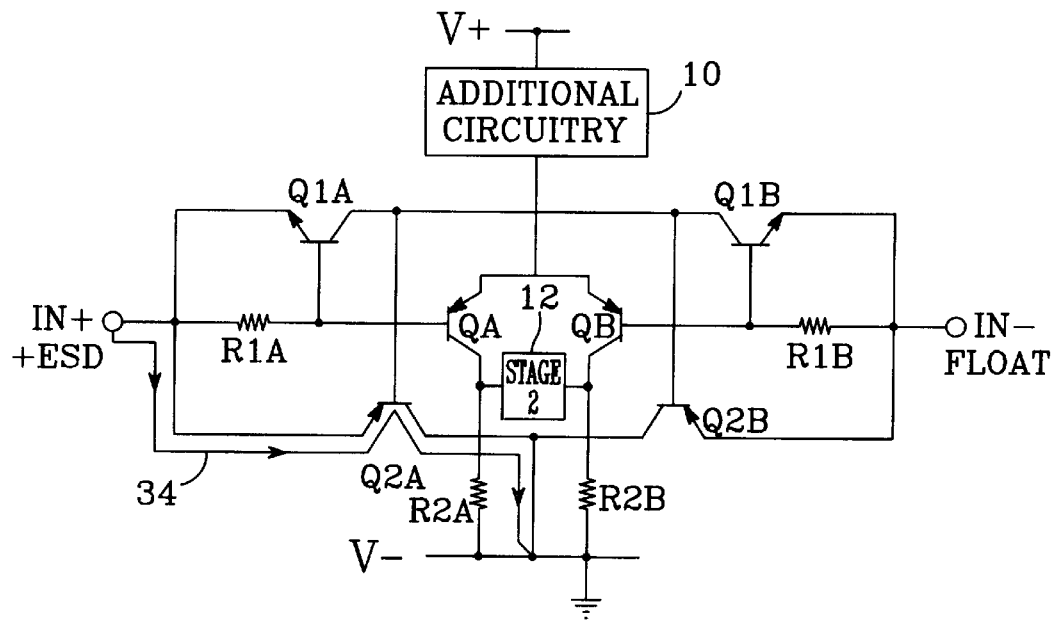
FIGS. 4a and 4b are schematic diagrams of the invention with a floating inverted input voltage, a grounded negative supply voltage, and respective positive and negative ESD events at the non-inverting input terminal.
Figure 4B:
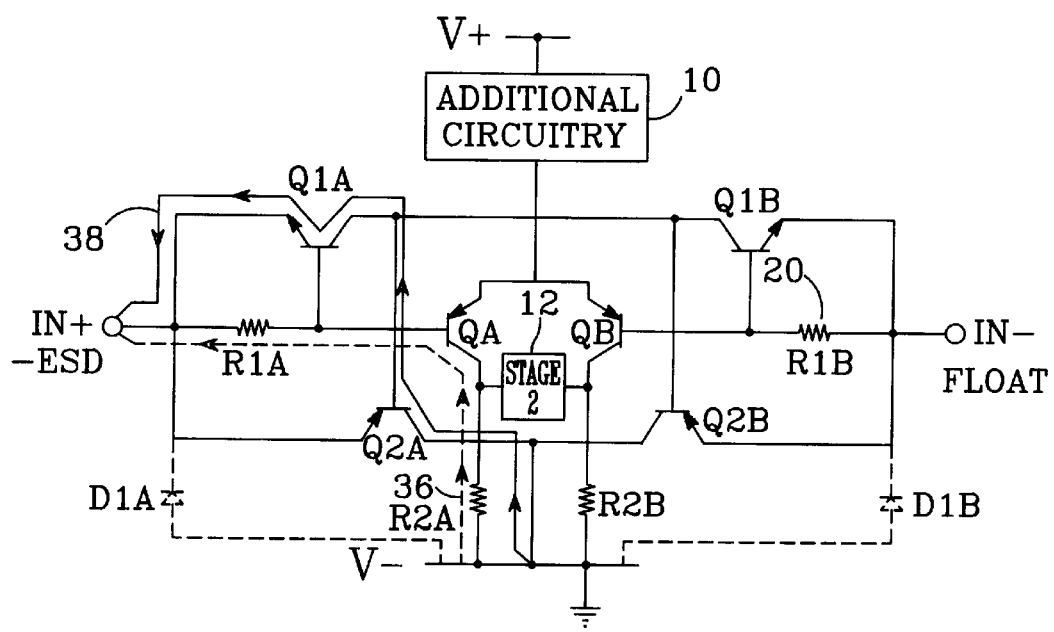

FIG. 4a illustrates the protection circuit's response to a positive ESD event at IN+, with IN− floating and V− at ground. In this case the emitter-collector breakdown current of Q2A provides the primary shunt for ESD current flow 34 from IN+ to V−. With a negative ESD at IN+, as illustrated in FIG. 4b, a current flow (dashed line 36) is initiated from V− through the forward biased collector-base junction of QA and through R1A to IN+. The voltage across R1A turns Q1A ON, which in turn forward biases the collector-base junction of Q2A. The collector-emitter circuit of Q1A and the collector-base circuit of Q2A then support the predominant ESD current flow 38. With some input stage circuits, a parasitic npn transistor with its base at the collector of QA, its emitter at the bases of QA and Q1A and its collector tied to V+ would provide an additional shunt current path.

Since both the differential input stage and the ESD protection circuit are symmetrical, an ESD event at the IN− terminal would be dissipated in a symmetrical fashion to the circuit's response to an ESD event at IN+ described above.

Figure 5:
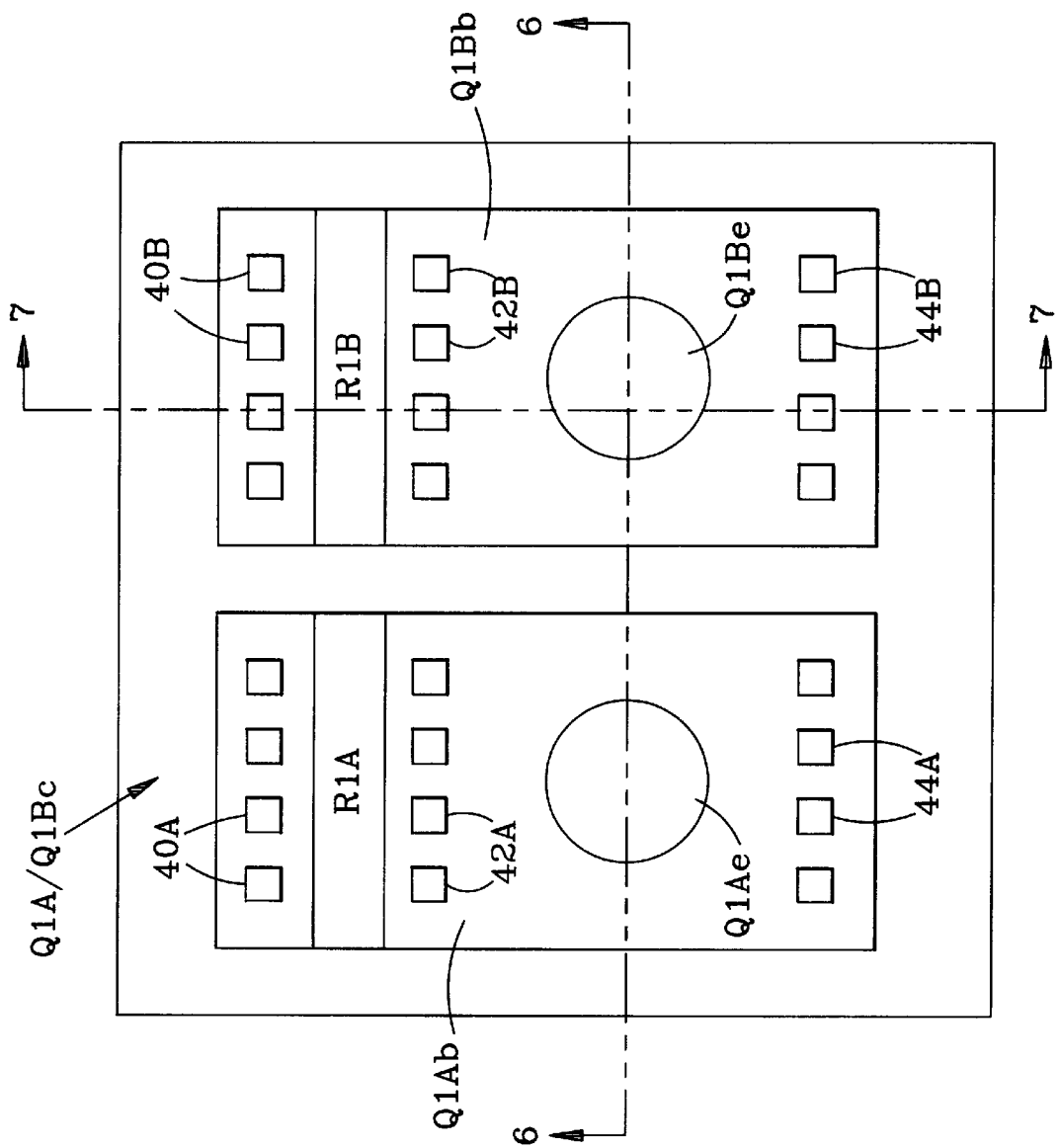
FIG. 5 is a plan view illustrating one layout of the invention on an IC chip.

FIG. 5 shows a preferred layout for Q1A and Q1B on an IC chip. Overlying metalization has been removed to fully expose the transistor elements. The common collector for the two devices, formed by an n-type epitaxial layer, is designated Q1A/Q1Bc. It surrounds a pair of p-type base regions Q1Ab and Q1Bb, with respective p-type emitter implants Q1Ae and Q1Be within the base regions. Resistors R1A and R1B are provided towards one end of the base regions Q1Ab and Q1Bb, respectively. Resistor contacts 40A along one side of R1A are aligned with contacts 42A on the opposite side of the resistor. Similarly, resistor contacts 40B are provided along one side of R1B in alignment with resistor contacts 42B on the opposite side of R1B. Respective base contacts 44A and 44B are provided at the opposite ends of the transistor bases from the resistors. Emitter and collector contacts would also be provided, but are not shown.

Figure 6:
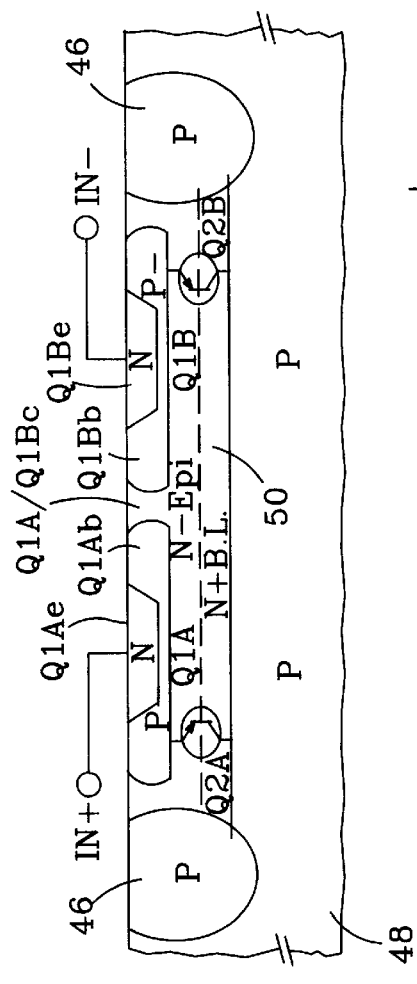
FIG. 6 is a sectional perspective view taken along the section line 6—6 of FIG. 5.
Figure 7:
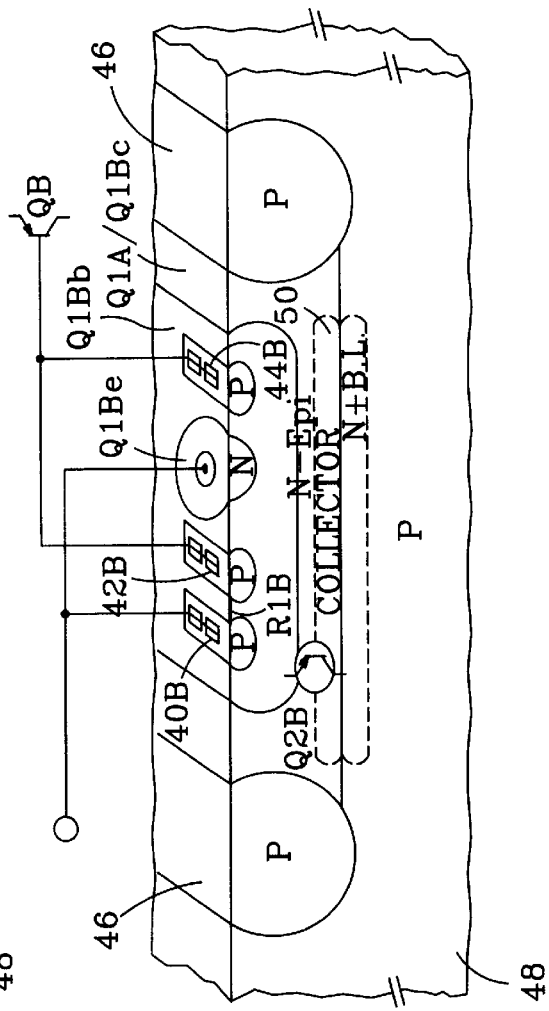
FIG. 7 is a sectional view taken along the section line 7—7 of FIG. 5.

The section views of FIGS. 6 and 7 show all of the protection circuit transistors Q1A, Q1B, Q2A and Q2B, along with a p-type isolation ring 46 that surrounds the transistors, a p-type substrate 48, and an N+ buried layer 50 between the substrate and the n-type epitaxial layer which forms the common collector Q1A/Q1Bc. From these views it can be seen that Q2A is formed as a vertical device with its emitter at the Q1Ab base of Q1A, its base in the n-type epitaxial region Q1A/Q1Bc, and its collector in the p-type substrate 48. Similarly, Q2B is a vertical device with its collector at the base of Q1B, its base at the collectors of Q1A and Q1B, and its collector at the substrate 48.

The invention could also be implemented with lateral pnp protection transistors, rather than the vertical parasitic devices illustrated in FIGS. 6 and 7. However, such an implementation would require separate pnp transistors with large emitter areas. Furthermore, the current gain of lateral transistors is not as great as for vertical devices, and less ESD protection would therefore be provided.

Although the ESD protection circuit described thus far has a component count of six (four transistors and two resistors), its layout configuration is small because of its shared regions. The collectors of Q1A and Q1B along with the bases of Q2A and Q2B are all connected together and constitute a common epitaxial region for the illustrative layout. The resistors R1A and R1B are connected between the base and emitter of Q1A and Q1B and in layout are components of the base regions. In this implementation the base sheet-resistivity is about 340 Ohms/sq. The resistors occupy one-quarter square each, giving them resistance values of approximately 100 Ohms including contact and p+ resistances.

The minimum junction area that can sustain a given single pulse power density with no damage can be estimated by using the well known Wunsch-Bell model for silicon junction damage due to local electro-thermal stress. The minimum junction area is calculated using the Wunsch-Bell Plot and parameters for the particular ESD model (such as human body model or machine model), the base-emitter junction reverse breakdown voltage, and intrinsic resistances that are dependent upon the particular process and geometry used. Thus, during peak positive or negative ESD currents, the currents in either Q1A or Q1B are directed vertically through the emitter-base junction. Based upon a single peak current of 1 A for 1000 nS, the Q1A or Q1B emitter junction area through which the current flows should be greater than 15 $\mu$sq. At higher currents emitter crowding may confine emitter-base currents to a fraction of the geometric junction area. Also, since ESD damage is due in essence to thermal events, the emitter-base regions can sustain frequent ESD bursts if current densities and field intensities are kept low.

In the described layout, the emitter areas of Q1A and Q1B were chosen to be 225 $\mu$sq, which was more than ten times the minimum calculated value. Base contacts were placed on both sides of the emitters to enhance current distribution.

Intrinsic resistances with this layout both allow and limit ESD currents. In allowing a peak current to bypass the comparator input stage, the protection circuit's ON resistance RON needs to be less than the base-emitter voltage of QA plus the reverse breakdown emitter-base voltage of QB, divided by the peak current. For a positive ESD event occurring differentially at the IN+ terminal with V− floating (FIG. 3a), for example, RON equals the sum of the collector and emitter resistances of Q2A and Q2B. Assuming a reverse emitter-base breakdown voltage of about 11 volts and a peak current of 1A, RON needs to be less than about 12V/1 A (12 Ohms).

With the geometries and process used, the collector resistances are 0.4–1 Ohms, while the emitter resistances are less than 0.4 Ohms. It is therefore expected that the protection circuitry will prevent damage in this mode from ESD peak currents as large as 2.5 A. For positive ESD events occurring at either input terminal with respect to the V− terminal, the reverse collector-emitter breakdown voltage of Q2A or Q2B shunts the ESD currents by having a lower breakdown voltage than the input stage circuitry. The ESD current is limited by the common collector resistance of Q2A and Q2B, the value of which can be crudely set by the placement of the Q2 contact to V−. Similarly, negative ESD currents are shunted and limited by the collector resistance for Q2A/Q2B.

Leakage current through the ESD protection circuit is insignificant during normal operation of the bipolar input stage. All of the protection circuit transistors are OFF and their thermal currents are less than 1 nA at ambient temperatures.

The only capacitance associated with the protection circuit that has any significant effect upon the protected input stage in its functional domain is the combination of the collector-base junction capacitances. The equivalent capacitance for the described layout and the process employed is less than 5 pF. The input signal propagation delay caused by this capacitance can be estimated at less than 0.5 nS by calculating the RC time constant of R1A, R1B and the equivalent capacitance.

The npn and pnp current gains ($\beta$) of the circuit during high ESD currents each need to be greater than about 15 for a collector current of 1 A. This is because the conducting path for most of the differential ESD current must be through npn Q1A/Q1B and pnp Q2A/Q2B when the V− terminal is floating. At a β of 25, Q2A/Q2B need 40 mA of base drive to conduct 1 A of ESD current. Many small emitter-base junctions would be damaged by reverse currents greater than this magnitude. Circular emitters and base contacts surrounding the periphery can improve the β by reducing emitter crowding and consequent high level injunction β degradation. Omission of the N+ buried layer, in processes that allow it, can result in enhanced vertical npn β and increases the collector resistances of Q1A and Q1B, which are conducive to more drive for pnp Q2A and Q2B when operating in reverse mode.

Figure 8:
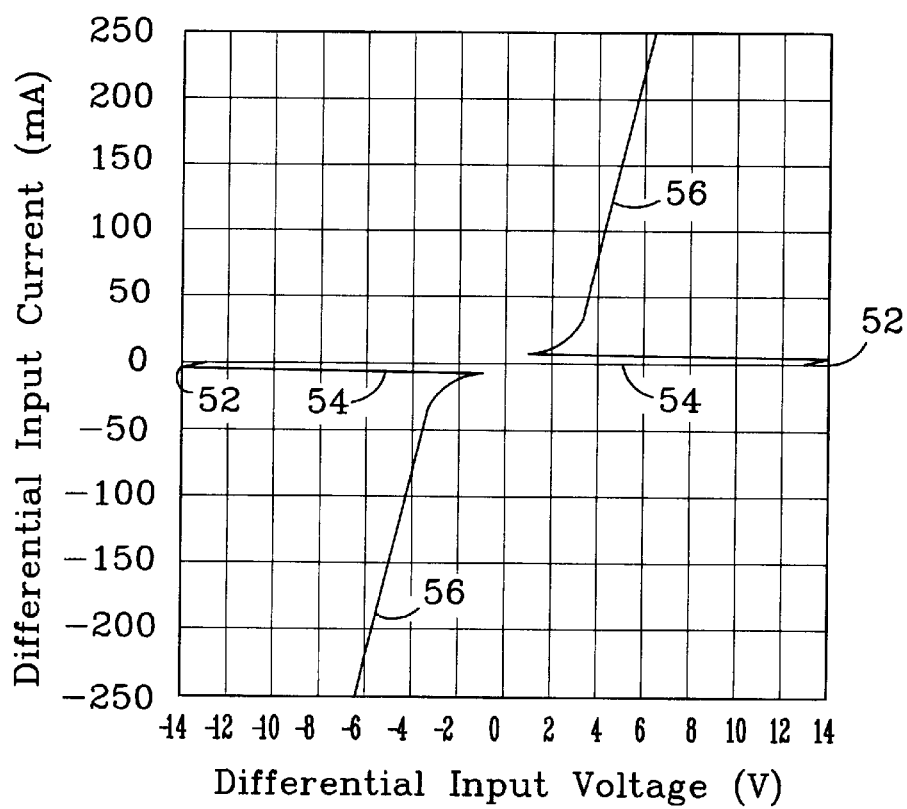
FIG. 8 is a current-voltage graph illustrating the invention's response to positive and negative ESD events for one implementation.

FIG. 8 shows a typical electrical behavior of the protection circuit in response to a sensed ESD event. When the protected device (QA or QB) breaks down at some differential input voltage 52 (approximately 14 volts for the case illustrated), the resultant input current builds up until the sense resistors R1A/R1B actuate the protection circuit. The differential input voltage then begins to collapse to the ON voltage of the activated ESD protection circuit, while the input current is shunted through the protection circuit (section 54). The ON voltage then increases in proportion to ESD current (section 56) until the differential input voltage again matches the breakdown voltage of the protected device. Thus, the maximum current protection afforded by the circuit depends upon its ON resistance. For very short repeated durations, typical maximum currents are in excess of 1A.

While particular embodiments of the invention have been shown and described, numerous variations and alternate embodiments will occur to those skilled in the art. Accordingly, it is intended that the invention be limited only in terms of the appended claims.

We claim:

1. An ESD protected circuit, comprising:
   an electrical circuit to be protected from ESD, said electrical circuit having an input terminal and conducting a progressively increasing current in response to an applied ESD at said input terminal,
   a current sensor connected in the path of said progressively increasing current through said electrical circuit, said current sensor developing a voltage that varies with the current through the current sensor, and
   a bypass circuit that responds to the voltage developed by said current sensor exceeding a level indicative of an ESD applied to said electrical circuit's input terminal by providing a bypass path for said ESD to prevent it from damaging said electrical circuit.

2. The ESD protected circuit of claim 1, said input terminal comprising one of a pair of differential input terminals, and further comprising a reference voltage terminal for said electrical circuit, said bypass circuit providing said bypass path between said reference voltage terminal and an input terminal to which an ESD is applied when a reference voltage is applied to said reference voltage terminal.

3. The ESD protected circuit of claim 1, said input terminal comprising one of a pair of differential input terminals, and further comprising a reference voltage terminal for said electrical circuit, said bypass circuit providing said bypass path between said input terminals when the voltage at said reference voltage terminal is floating.

4. The ESD protected circuit of claim 1, wherein said bypass circuit is normally non-conductive.

5. An ESD protected circuit, comprising:
   an electrical circuit to be protected from ESD, said electrical circuit providing an actuation signal in response to an applied ESD, and
   a bypass circuit that responds to said actuation signal by providing a bypass path for said ESD to prevent it from damaging said electrical circuit, said bypass circuit comprising a pair of bipolar transistors of a first conductivity connected to be actuated by a current flow through said electrical circuit, and a pair of bipolar transistors of opposite conductivity and connected to be actuated by current flows through said first conductivity transistors.

6. The ESD protected circuit of claim 5, said electrical circuit including a pair of input terminals and a reference voltage terminal wherein, in response to a differential ESD across said input terminals and a reference voltage at said reference voltage terminal, a current flow is induced through said electrical circuit, said current flow actuating one of said first conductivity transistors, and the actuation of said first cnductivity transistor actuating one of said second conductivity transistors to establish an ESD bypass path between the input terminal to which said ESD is applied and said reference voltage terminal.

7. The ESD protected circuit of claim 5, said electrical circuit including a pair of input terminals and a reference voltage terminal wherein, in response to a differential ESD across said input terminals and a floating voltage at said reference voltage terminal, a current flow is induced through said electrical circuit, said current flow actuating one of said first conductivity transistors, and the actuation of said first conductivity transistor actuating both of said second conductivity transistors to establish an ESD bypass path between said input terminals.

8. The ESD protected circuit of claim 5, said electrical circuit including a pair of input terminals and a reference voltage terminal wherein, in response to an ESD at one of said input terminals with respect to said reference voltage terminal, a current flow is induced through said electrical circuit to actuate one of said first conductivity transistors and establish an ESD bypass path, between said ESD input terminal and said reference voltage terminal, via said actuated transistor and a forward biased portion of one of said second conductivity transistors.

9. An ESD protected circuit comprising:
   an electrical circuit to be protected from ESD, said electrical circuit conducting a progressively increasing current in response to an applied ESD, and
   a bypass circuit that is normally non-conductive but responds to said protected circuit current exceeding a threshold level by becoming conductive to provide a bypass path for said ESD to prevent it from damaging said electrical circuit, said bypass circuit comprising a pair of bipolar transistors of a first conductivity connected to be actuated by said electrical circuit's current exceeding said threshold level, and a pair of bipolar transistors of opposite conductivity and connected to be actuated by current flows through said first conductivity transistors.

10. The ESD protected circuit of claim 9, said electrical circuit including a pair of input terminals and a reference voltage terminal wherein, in response to a differential ESD across said input terminals and a reference voltage at said reference voltage terminal, a current flow is induced through said electrical circuit that reaches said threshold level, said current actuating one of said first conductivity transistors, and the actuation of said first conductivity transistor actuating one of said second conductivity transistors to establish an ESD bypass path between the input terminal to which said ESD is applied and said reference voltage terminal.

11. The ESD protected circuit of claim 9, said electrical circuit including a pair of input terminals and a reference voltage terminal wherein, in response to a differential ESD across said input terminals and a floating voltage at said reference voltage terminal, a current flow is induced through said eletrical circuit that reaches said threshold level, said current actuating one of said first conductivity transistors, and the actuation of said first conductivity transistor actuating both of said second conductivity transistors to establish an ESD bypass path between said input terminals.

12. The ESD protected circuit of claim 9, said electrical circuit including a pair of input terminals and a reference voltage terminal wherein, in response to an ESD at one of said input terminals with respect to said reference voltage terminal, said electrical circuit conducts a current that reaches said threshold level to actuate one of said first conductivity transistors and establish an ESD bypass path, through said actuated transistor and a forward biased portion of one of said second conductivity transistors, between said ESD input terminal and said reference voltage terminal.

13. An ESD protected differential circuit, comprising:
   a pair of input terminals,
   a reference voltage terminal,
   an electrical circuit having a pair of input bipolar transistors whose bases are connected in circuit with respective ones of said input terminals to provide a differential input to the circuit,
   a pair of bipolar bypass transistors of a first conductivity whose bases are connected to the bases of respective ones of the input transistors, and whose collector-emitter circuits are connected in series between said input terminals, and
   a pair of bipolar bypass transistors of a second conductivity opposite to said first conductivity whose bases are connected to the series connection between said first conductivity transistors, and whose collector-emitter circuits are connected between said reference voltage terminal and respective ones of said input terminals.

14. The ESD protected differential circuit of claim 13, further comprising respective resistors between the bases and emitters of said first conductivity bypass transistors, each of said resistors developing a voltage, in response to a current between said input terminals through said electrical circuit exceeding a respective threshold, sufficient to turn on its respective first conductivity bypass transistor.

15. The ESD protected differential circuit of claim 14, wherein said transistors are arranged so that, with a reference voltage applied to said reference voltage terminal, an ESD at one of said input terminals with respect to the other input terminal causes a current to flow through said electrical circuit sufficient to turn on the first conductivity bypass transistor whose collector-emitter circuit is connected to said other input terminal, which in turn causes the second conductivity bypass transistor connected to said one input terminal to turn on and establish an ESD bypass path between said one input terminal and said reference voltage terminal.

16. The ESD protected differential circuit of claim 14, wherein said transistors are arranged so that, with the voltage at said reference voltage terminal floating, an ESD at one of said input terminals with respect to the other terminal causes a current to flow through the electrical circuit sufficient to turn on the first conductivity bypass transistor whose collector-emitter circuit is connected to said other input terminal, which in turn causes both of said second conductivity bypass transistors to turn on and establish an ESD bypass path between said input terminals.

17. The ESD protected differential circuit of claim 14, wherein said transistors are arranged so that, with a reference voltage applied to said reference voltage terminal, an ESD at one of said input terminals with respect to said reference voltage terminal causes a current to flow through one of the electrical circuit's input transistors sufficient to turn on the first conductivity bypass transistor whose collector-emitter circuit is connected to said one input terminal, which in turn establishes an ESD bypass path between said one input terminal and said reference voltage terminal through the collector-emitter circuit of said first conductivity bypass transistor and the base-collector circuit of the second conductivity bypass transistor whose collector-emitter circuit is connected to said one input terminal.

* * * * *